US012787896B2

(12) United States Patent
Hegedüs

(10) Patent No.: US 12,787,896 B2
(45) Date of Patent: Nov. 3, 2026

(54) POWER SEMICONDUCTOR MODULE ARRANGEMENT

(71) Applicant: Infineon Technologies AG, Neubiberg (DE)

(72) Inventor: Ákos Ferenc Hegedüs, Budapest (HU)

(73) Assignee: Infineon Technologies AG, Neubiberg (DE)

(*) Notice: Subject to any disclaimer, the term of this patent is extended or adjusted under 35 U.S.C. 154(b) by 412 days.

(21) Appl. No.: 18/492,027

(22) Filed: Oct. 23, 2023

(65) Prior Publication Data

US 2024/0145362 A1 May 2, 2024

(30) Foreign Application Priority Data

Oct. 28, 2022 (EP) .................................... 22204304

(51) Int. Cl.

| | |
|---|---|
| ***H10W 90/00*** | (2026.01) |
| ***H10W 70/60*** | (2026.01) |
| ***H10W 70/65*** | (2026.01) |
| ***H10W 72/00*** | (2026.01) |
| ***H10W 72/50*** | (2026.01) |

(52) U.S. Cl.

CPC ........ *H10W 90/701* (2026.01); *H10W 70/611* (2026.01); *H10W 70/65* (2026.01); *H10W 72/50* (2026.01); *H10W 90/00* (2026.01); *H10W 72/884* (2026.01); *H10W 90/734* (2026.01);

(Continued)

(58) Field of Classification Search

CPC . H10W 90/701; H10W 90/00; H10W 72/884; H10W 90/734; H10W 90/753; H10W 90/754; H10W 72/50; H10W 70/65; H10W 70/611

See application file for complete search history.

(56) References Cited

U.S. PATENT DOCUMENTS

2009/0321900 A1 12/2009 Yoshida et al.
2018/0145007 A1* 5/2018 Hatano ................ H10W 40/22

(Continued)

FOREIGN PATENT DOCUMENTS

CN 113270373 A * 8/2021 ........... H10D 12/411
DE 8700978 U1 3/1987

(Continued)

*Primary Examiner* — David Vu
*Assistant Examiner* — Brandon C Fox
(74) *Attorney, Agent, or Firm* — Murphy, Bilak & Homiller, PLLC

(57) ABSTRACT

A power semiconductor module arrangement includes: a housing; a substrate arranged in or forming a bottom of the housing, the substrate including a dielectric insulation layer and a first metallization layer attached to the dielectric insulation layer; a semiconductor arrangement on the substrate; and bus bars electrically coupled to each other by the semiconductor arrangement and/or the first metallization layer. Each bus bar has opposing first and second ends, a first surface having a first outline, and a second surface opposite the first surface, the second surface having a second outline that is a projection of the first outline. The first end of each bus bar is electrically and mechanically coupled to the substrate, the second end extending to the outside of the housing. The outline of the first surface of a bus bar is identical to the outline of the first surface of each of the other bus bars.

14 Claims, 6 Drawing Sheets

(52) U.S. Cl.
CPC ........ *H10W 90/753* (2026.01); *H10W 90/754* (2026.01)

(56) References Cited

U.S. PATENT DOCUMENTS

| | | | | |
|---|---|---|---|---|
| 2018/0182694 | A1 | 6/2018 | Soyano | |
| 2018/0342440 | A1 * | 11/2018 | Nishiyama | H01L 25/115 |

FOREIGN PATENT DOCUMENTS

| | | | |
|---|---|---|---|
| EP | 0780898 | A1 | 6/1997 |
| EP | 2071626 | A1 | 6/2009 |

* cited by examiner

POWER SEMICONDUCTOR MODULE ARRANGEMENT

TECHNICAL FIELD

The instant disclosure relates to a power semiconductor module arrangement, in particular to a power semiconductor module arrangement comprising a plurality of bus bars.

BACKGROUND

Power semiconductor module arrangements often include at least one substrate (e.g., ceramic substrate) arranged in a housing. A semiconductor arrangement including a plurality of controllable semiconductor elements (e.g., IGBTs, diodes, or other semiconductor devices) is arranged on each of the at least one substrate. Each substrate usually comprises a substrate layer (e.g., a ceramic layer), a first metallization layer deposited on a first side of the substrate layer and a second metallization layer deposited on a second side of the substrate layer. The controllable semiconductor elements are mounted, for example, on the first metallization layer. The second metallization layer may optionally be attached to a base plate. The controllable semiconductor devices are usually mounted to the substrate by soldering or sintering techniques.

Electrical lines or electrical connections are used to connect different semiconductor devices of the power semiconductor arrangement with each other. Further, terminal elements and bus bars or conductor rails are provided to contact the semiconductor arrangement from the outside of the housing. Such terminal elements, bus bars and conductor rails are usually electrically coupled to the first metallization layer with a first end. A second end of the terminal elements, bus bars and conductor rails protrudes out of the housing.

There is a need for a power semiconductor module arrangement that may be produced easily and cost-effectively and that provides a high degree of flexibility.

SUMMARY

A power semiconductor module arrangement includes a housing, a substrate arranged in or forming a bottom of the housing, the substrate including a dielectric insulation layer and a first metallization layer attached to the dielectric insulation layer, a semiconductor arrangement arranged on the substrate, and a plurality of bus bars electrically coupled to each other by means of the semiconductor arrangement and/or the first metallization layer, each of the plurality of bus bars including a first end, a second end opposite the first end, a first surface having a first outline, and a second surface opposite the first surface, the second surface having a second outline that is a projection of the first outline, wherein the first end of each of the plurality of bus bars is electrically and mechanically coupled to the substrate, and the second end of each of the plurality of bus bars extends to the outside of the housing, each of the plurality of bus bars includes a metal sheet, and the outline of the first surface of a bus bar is identical to the outline of the first surface of each of the other bus bars of the plurality of bus bars.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description, as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". An electrical line or electrical connection as described herein may be a single electrically conductive element, or include at least two individual electrically conductive elements connected in series and/or parallel. Electrical lines and electrical connections may include metal and/or semiconductor material, and may be permanently electrically conductive (i.e., non-switchable). A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
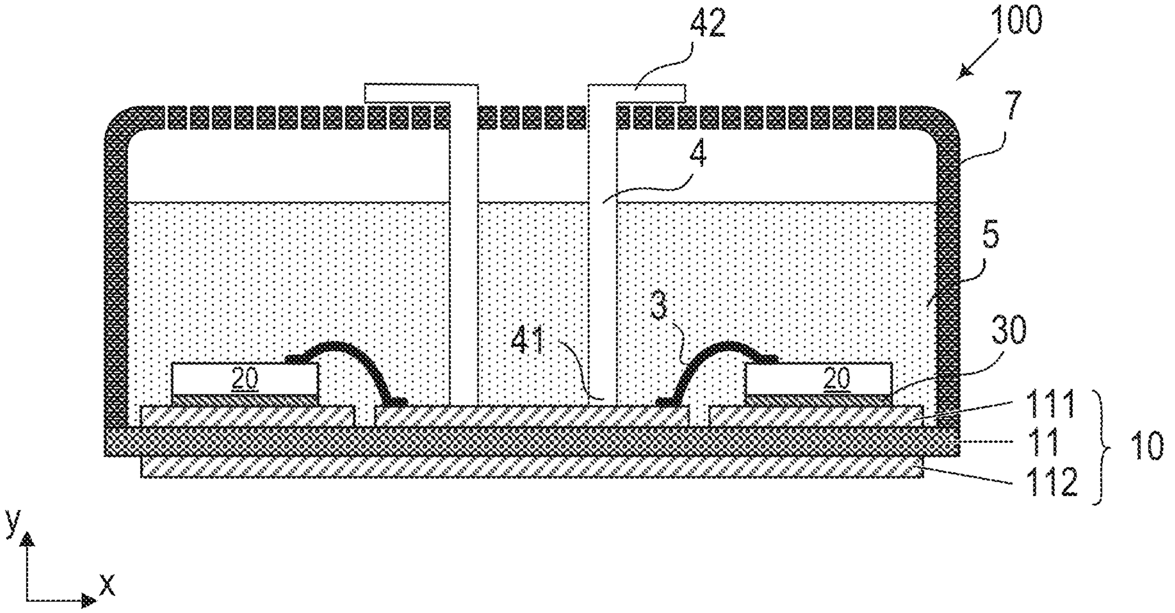
FIG. 1 is a cross-sectional view of a power semiconductor module arrangement.

Referring to FIG. 1, a cross-sectional view of a power semiconductor module arrangement 100 is schematically illustrated. The power semiconductor module arrangement 100 includes a housing 7 and a substrate 10. The substrate 10 includes a dielectric insulation layer 11, a (structured) first metallization layer 111 attached to the dielectric insulation layer 11, and a second (structured) metallization layer 112 attached to the dielectric insulation layer 11. The dielectric insulation layer 11 is disposed between the first and second metallization layers 111, 112.

Each of the first and second metallization layers 111, 112 may consist of or include one of the following materials: copper; a copper alloy; aluminum; an aluminum alloy; any other metal or alloy that remains solid during the operation of the power semiconductor module arrangement 100. The substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 11 may consist of or include one of the following materials: $Al_2O_3$, AlN, SiC, BeO or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $SiO_2$, $Al_2O_3$, AN, or BN and may have a diameter of between about 1 μm and about 50 μm. The substrate 10 may also be a conventional printed circuit board (PCB) having a non-ceramic dielectric insulation layer 11. For instance, a non-ceramic dielectric insulation layer 11 may consist of or include a cured resin.

The substrate 10 may be arranged in a housing 7. In the example illustrated in FIG. 1, the substrate 10 forms a ground surface of the housing 7, while the housing 7 itself solely comprises sidewalls and a cover. This is, however, only an example. It is also possible that the housing 7 further comprises a ground surface and the substrate 10 be arranged on the ground surface inside the housing 7. According to another example, the substrate 10 may be mounted on a base plate (not illustrated). In some power semiconductor module arrangements 100, more than one substrate 10 is arranged on the ground surface of a housing 7 or on a single base plate (not illustrated). A base plate may form a ground surface of the housing 7, for example.

One or more semiconductor bodies 20 may be arranged on the at least one substrate 10 (e.g., on the first metallization layer 111). Each of the semiconductor bodies 20 arranged on the at least one substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable semiconductor element.

The one or more semiconductor bodies 20 may form a semiconductor arrangement on the substrate 10. In FIG. 1, only two semiconductor bodies 20 are exemplarily illustrated. The second metallization layer 112 of the substrate 10 in FIG. 1 is a continuous layer. The first metallization layer 111 is a structured layer in the example illustrated in FIG. 1. "Structured layer" means that the first metallization layer 111 is not a continuous layer, but includes recesses between different sections of the layer. Such recesses are schematically illustrated in FIG. 1. The first metallization layer 111 in this example includes three different sections. This, however, is only an example. Any other number of sections is possible. Different semiconductor bodies 20 may be mounted to the same or to different sections of the first metallization layer 111. Different sections of the first metallization layer may have no electrical connection or may be electrically connected to one or more other sections using, e.g., bonding wires 3. Electrical connections 3 may also include bonding ribbons, connection plates or conductor rails, for example, to name just a few examples. The one or more semiconductor bodies 20 may be electrically and mechanically connected to the substrate 10 by an electrically conductive connection layer 30. Such an electrically conductive connection layer 30 may be a solder layer, a layer of an electrically conductive adhesive, or a layer of a sintered metal powder, e.g., a sintered silver powder, for example. According to other examples, it is also possible that the second metallization layer 112 is a structured layer. It is further possible to omit the second metallization layer 112 altogether.

The power semiconductor module arrangement 100 illustrated in FIG. 1 further includes a plurality of conductor rails or bus bars 4 (in the following only referred to as bus bars). The bus bars 4 are electrically connected to the first metallization layer 111 and provide an electrical connection between the inside and the outside of the housing 7. The bus bars 4 may be electrically connected to the first metallization layer 111 with a first end 41, while a second end 42 of the bus bars 4 protrudes out of the housing 7. The bus bars 4 may be electrically contacted from the outside at their second end 42. In the example illustrated in FIG. 1, a first part of the bus bars 4 extends through the inside of the housing 7 in a vertical direction y. The vertical direction y is a direction perpendicular to a top surface of the substrate 10, wherein the top surface of the substrate 10 is a surface on which the at least one semiconductor body 20 is mounted. The second ends 42 of the bus bars 4 are bent such that they extend in a first horizontal direction x which is parallel to the top surface of the substrate 10. In this way, for some applications it may be easier to electrically contact the second ends 42. The bus bars 4 illustrated in FIG. 1, however, are only examples. Bus bars 4 generally may be implemented in any other way and may be arranged anywhere within the housing 7. For example, as will be described in further detail below, one or more bus bars 4 may be arranged close to or adjacent to the sidewalls of the housing 7.

The power semiconductor module arrangement 100 may further comprise a plurality of terminal elements (not specifically illustrated in FIG. 1). Terminal elements are generally configured to conduct control signals to and from the substrate 10. Control signals usually comprise electrical signals of 15V or less and are configured to control the function of the different semiconductor bodies 20. Control signals, however, may also comprise electrical signals of more than 15V. It is further necessary to provide supply voltages to the power semiconductor module arrangement 100. The power semiconductor module arrangement 100 may switch from an off state (non-working state) to an on state (working state), for example, when a supply voltage is provided. Supply voltages are generally high voltages of more than 100V, more than 300V, more than 600V and even up to several thousands of volts. The supply voltage can be between 500 V and 10 kV, or between 600V and 6.5 kV, for example. The bus bars 4 are configured to provide such a supply voltage. Bus bars 4 may also be used to provide control signals of (significantly) more than 15V, for example.

Terminal elements that are used to conduct control signals to and from the substrate 10 are often implemented as simple pins. The bus bars 4, on the other hand, in order to be able to provide the significantly higher supply voltages and, in particular, the resulting high currents, have a larger cross-sectional area as compared to the terminal elements. According to one example, each of the plurality of bus bars 4, therefore, comprises a metal sheet. Each of the plurality of bus bars 4 may further comprise legs extending from the metal sheet, wherein the legs are arranged at or form the first end 41 of the bus bar 4 and are electrically and mechanically connected to the substrate 10. The bus bars 4 will be described in further detail below.

The semiconductor bodies 20 each may include a chip pad metallization (not specifically illustrated), e.g., a source, drain, collector, emitter, anode, cathode, or gate metallization. A chip pad metallization generally provides a contact surface for electrically connecting the semiconductor body 20. A chip pad metallization may electrically contact a connection layer 30, a bus bar 4, or an electrical connection 3, for example. A chip pad metallization may consist of or include a metal such as aluminum, copper, gold, or silver, for example. The electrical connections 3 and the bus bars 4 may also consist of or include a metal such as copper, aluminum, gold, or silver, for example. Other materials, however, are also possible.

Figure 2:
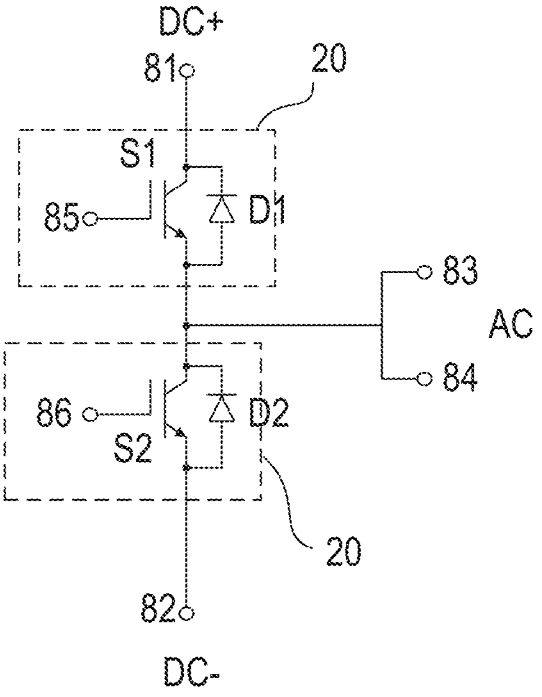
FIG. 2 schematically illustrates a circuit arrangement according to one example.

As has been mentioned above, the power semiconductor module arrangement 100 comprises a semiconductor arrangement arranged on the substrate 10, the semiconductor arrangement comprising at least two semiconductor bodies 20. The at least two semiconductor bodies 20 may be arranged in a half-bridge configuration, for example. FIG. 2 is a circuit diagram of an exemplary half-bridge arrangement. The half-bridge arrangement is configured to convert a DC voltage provided at an input DC+, DC− of the half-bridge arrangement into an AC voltage. The AC voltage may be provided to, e.g., a load (not illustrated), that is coupled to an output AC of the half-bridge arrangement. The half-bridge arrangement is coupled between a first supply node 81 which is configured to be operatively coupled to a first electrical potential DC+ and a second supply node 82 which is configured to be operatively coupled to a second electrical potential DC−. The first electrical potential DC+ may be a positive potential and the second electrical potential DC− may be a negative potential to supply a DC voltage via the first and second supply nodes 81, 82. The first and second supply nodes 81, 82 form the input of the half-bridge arrangement.

The half-bridge may include one high-side switch S1 (first switching element) and one low-side switch S2 (second switching element) coupled in series to each other between the first supply node 81 and the second supply node 82. The half-bridge arrangement may be configured to drive a load (not specifically illustrated) at an output node 83, 84 of the half-bridge arrangement. The load may be an inductive load, for example. The output node 83, 84 is electrically connected to a common node between the first switching element S1 and the second switching element S2.

In the circuit arrangement of FIG. 2, each switching element S1, S2 of the half-bridge arrangement is implemented as an IGBT (insulated-gate bipolar transistor). This, however, is only an example. The switching elements S1, S2 may also be implemented as MOSFETs (Metal Oxide Semiconductor Field-Effect Transistor), JFETs (Junction Field Effect Transistor), HEMTs (High Electron Mobility Transistor), BJTs (Bipolar Junction Transistor), or any other kind of transistor, for example. Each of the switching elements S1, S2 may comprise an internal or external freewheeling diode D1, D2. According to another example, each of the switching elements S1, S2 comprises two or more separate switching elements electrically coupled in parallel to each other (not specifically illustrated). Each of the first switching element S1 and the second switching element S2 further includes a control electrode 85, 86 and a controllable load path between a first load electrode and a second load electrode. The load paths of the first switching element S1 and the second switching element S2 are coupled in series and between the first supply node 81 and the second supply node 82.

One or more different bus bars 4 may be provided in order to electrically contact the half-bridge arrangement according to the example of FIG. 2. According to one example, one bus bar 4 may be provided to form or to contact the first supply node 81, one bus bar 4 may be provided to form or to contact the second supply node 82, and two bus bars 4 may be provided to form or to contact the output node 83, 84. The different bus bars 4 are electrically coupled to each other by means of the semiconductor arrangement and/or the first metallization layer 111 of the substrate 10. The power semiconductor module arrangement 100 may further comprise terminal elements to provide, e.g., control signals for controlling the semiconductor elements 20 of the power semiconductor module arrangement 100. For example, control signals may be provided to the control terminal 85 of the first switching element S1 and the control terminal 86 of the second switching element S2 by means of one or more terminal elements.

Figure 3:
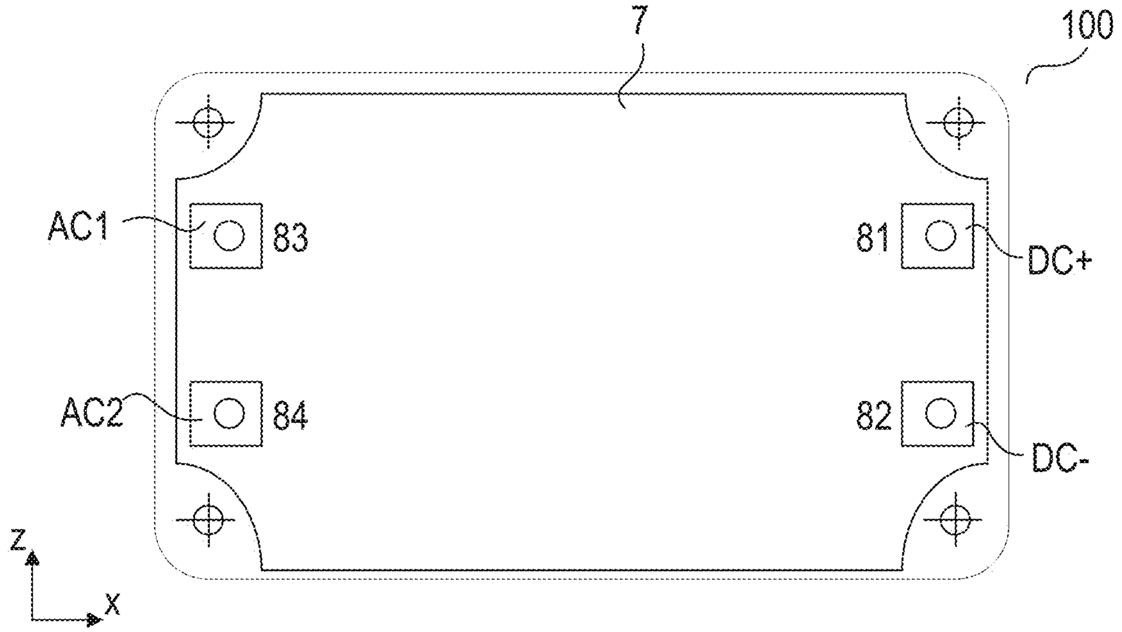
FIG. 3 schematically illustrates a top view of a power semiconductor module arrangement according to one example.

FIG. 3 schematically illustrates a top view of a power semiconductor module arrangement 100 according to one example. In this top view, the housing 7 (i.e., the lid or cover of the housing 7) conceals any components arranged inside the housing 7. Therefore, the substrate 10 and any components arranged thereon are not visible in the top view of FIG. 3. FIG. 3, however, illustrates the second ends of the plurality of bus bars 4, which protrude to the outside of the housing 7. As is indicated in FIG. 3, different ones of the plurality of bus bars 4 may form the first supply node 81 which is configured to be operatively coupled to a first electrical potential DC+, the second supply node 82 which is configured to be operatively coupled to a second electrical potential DC−, and the output node 83, 84 that is configured to provide an AC voltage.

Figure 4:
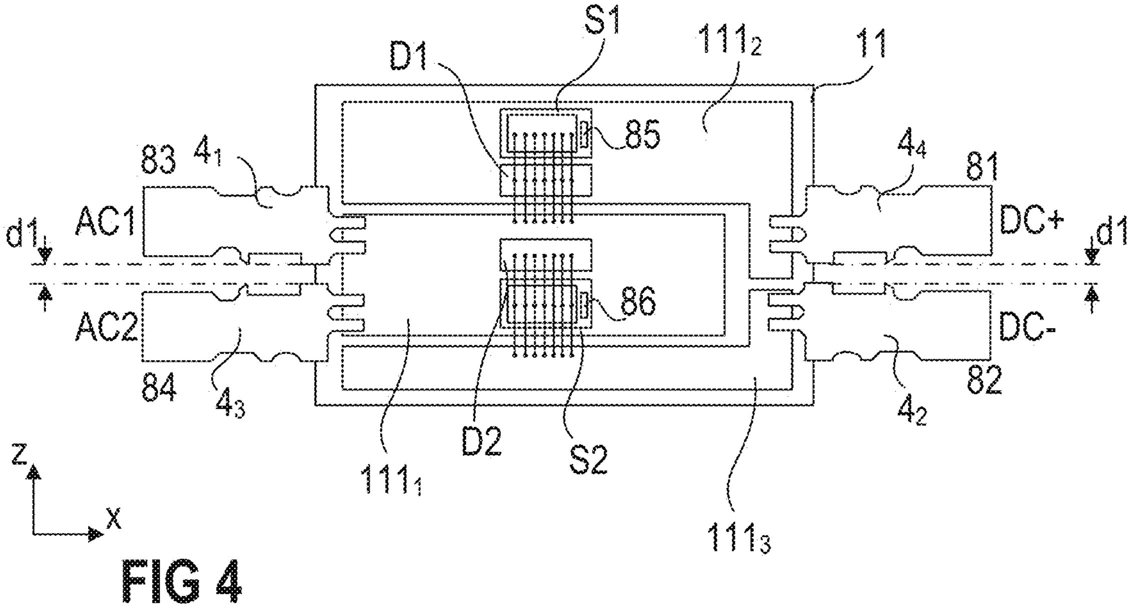
FIG. 4 schematically illustrates a top view of a power semiconductor module arrangement according to another example.

Now referring to FIG. 4, a first bus bar $\mathbf{4}_1$ and a third bus bar $\mathbf{4}_3$ forming or being connected to the output node 83, 84 may be electrically and mechanically coupled to a first section $\mathbf{111}_1$ of the first metallization layer 111. A second bus bar $\mathbf{4}_2$ forming or being connected to the second supply node 82 may be electrically and mechanically coupled to a third section $\mathbf{111}_3$ of the first metallization layer 111, and a fourth bus bar $\mathbf{4}_4$ forming or being connected to the first supply node 81 may be electrically and mechanically coupled to a second section $\mathbf{111}_2$ of the first metallization layer 111. That is, one or more bus bars 4 that are electrically coupled to the same electrical potential may be electrically coupled to the same section of the first metallization layer 111. This, however, is only an example. It is also possible that different bus bars 4 that are electrically coupled to the same electrical potential are electrically coupled to two or more different sections of the first metallization layer 111. Such sections, however, may be electrically coupled to each other by means of bonding wires, connection plates or conductor rails, for example.

The layout of the power semiconductor module arrangement 100, and in particular the position of the different bus bars 4 within the housing 7 may have an influence, for example, with regard to the switching behavior of the semiconductor arrangement. Therefore, the positions of the individual bus bars 4 within the housing 7 may be chosen to comply with requirements concerning creepage distances and to improve the switching behavior of the half-bridge arrangement. The specific arrangement of the different bus bars 4, however, may also be chosen in order to fulfill other requirements.

As is schematically illustrated in FIGS. 3 and 4, the bus bars 4 may be arranged in pairs, for example. According to one example, the first bus bar $4_1$ and the third bus bar $4_3$ which are connected to the same electrical potential may form a first pair of bus bars 4, and the second bus bar $4_2$ and the fourth bus bar $4_4$ which are connected to the first electrical potential DC+ and the second electrical potential DC−, respectively, may form a second pair of bus bars 4. The bus bars 4 of each pair of bus bars 4 may be arranged adjacent to each other. That is, the first bus bar $4_1$ and the third bus bar $4_3$ may be arranged adjacent to each other. A shortest distance d1 between the first bus bar $4_1$ and the third bus bar $4_3$ in a horizontal direction z may be between 1 and 60 mm, between 1 and 10 mm, or between 3 and 7 mm, for example. According to one example, the shortest distance d1 between the first bus bar $4_1$ and the third bus bar $4_3$ in a horizontal direction z may be 5 mm. Similarly, the second bus bar $4_2$ and the fourth bus bar $4_4$ may be arranged adjacent to each other. A shortest distance d1 between the second bus bar $4_2$ and the fourth bus bar $4_4$ in a horizontal direction z may also be between 1 and 60 mm, between 1 and 10 mm, or between 3 and 7 mm, for example. According to one example, the shortest distance d1 between the second bus bar $4_2$ and the fourth bus bar $4_4$ in a horizontal direction z may be 5 mm. The first bus bar $4_1$ and the third bus bar $4_3$ may be arranged along a first side, and the second bus bar $4_2$ and the fourth bus bar $4_4$ may be arranged along a second side of the power semiconductor module arrangement 100. The second side may be opposite the first side, for example.

Still referring to FIG. 4, the power semiconductor module arrangement 100 may further comprise a first switching element S1 arranged on the second section $111_2$ of the first metallization layer 111, and a second switching element S2 arranged on the first section $111_1$ of the first metallization layer 111. The first switching element S1 and the second switching element S2 may be arranged in a half-bridge arrangement, similar to what has been described with respect to FIG. 2 above. Each of the first and second switching element S1, S2 may be implemented as an IGBT (insulated-gate bipolar transistor), as a MOSFETs (Metal Oxide Semiconductor Field-Effect Transistor), as a JFETs (Junction Field Effect Transistor), as a HEMTs (High Electron Mobility Transistor), as a BJTs (Bipolar Junction Transistor), or any other kind of transistor, for example. The semiconductor arrangement may further comprise (external) freewheeling diodes D1, D2, for example, similar to what has been described with respect to FIG. 2 above. According to another example, each of the switching elements S1, S2 comprises two or more separate switching elements electrically coupled in parallel to each other (not specifically illustrated in FIG. 4). Connections between the switching elements S1, S2, the diodes D1, D2 and the first metallization layer 111 may be implemented by means of bonding wires or bonding ribbons, for example. A chip pad metallization of each of the switching elements S1, S2 and diodes D1, D2 may be connected to a respective section of the first metallization layer 111 by means of an electrically conductive connection layer, for example.

Figure 5A:
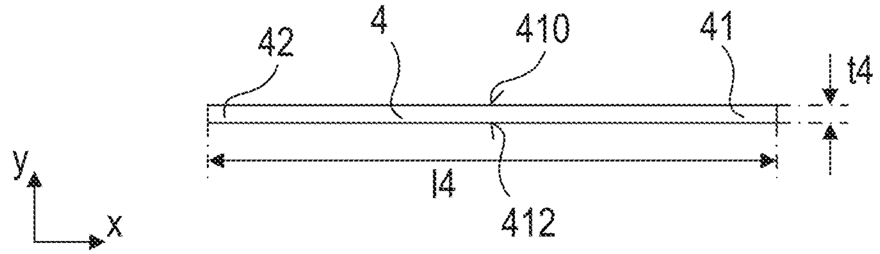
FIGS. 5A and 5B schematically illustrate a side view and a top view, respectively, of bus bars according to one example.

Each of the bus bars 4 of a plurality of bus bars 4 of a power semiconductor module arrangement 100 may be identical to the other bus bars 4 of the plurality of bus bars 4. That is the shape and the dimensions of the different bus bars 4 of a power semiconductor module arrangement 100 may be identical. The bus bars 4 may also include identical materials. In this way, the electrical and mechanical properties of the different bus bars 4 are also identical. As is schematically illustrated in the side view of FIG. 5A, a bus bar 4 comprises a first surface 410 and a second surface 412, opposite the first surface 410. A thickness t4 of the bus bar 4 is defined by a distance between the first surface 410 and the second surface 412. The first surface 410 has a first outline, and the second surface 412 has a second outline that is a projection of the first outline. A shape of a bus bar 4 as defined by the first outline of the first surface 410 may be asymmetric, for example. Bus bars 4 having an asymmetric shape are schematically illustrated in FIGS. 4, 5B, 6, 8, 9 and 10, for example.

Figure 5B:
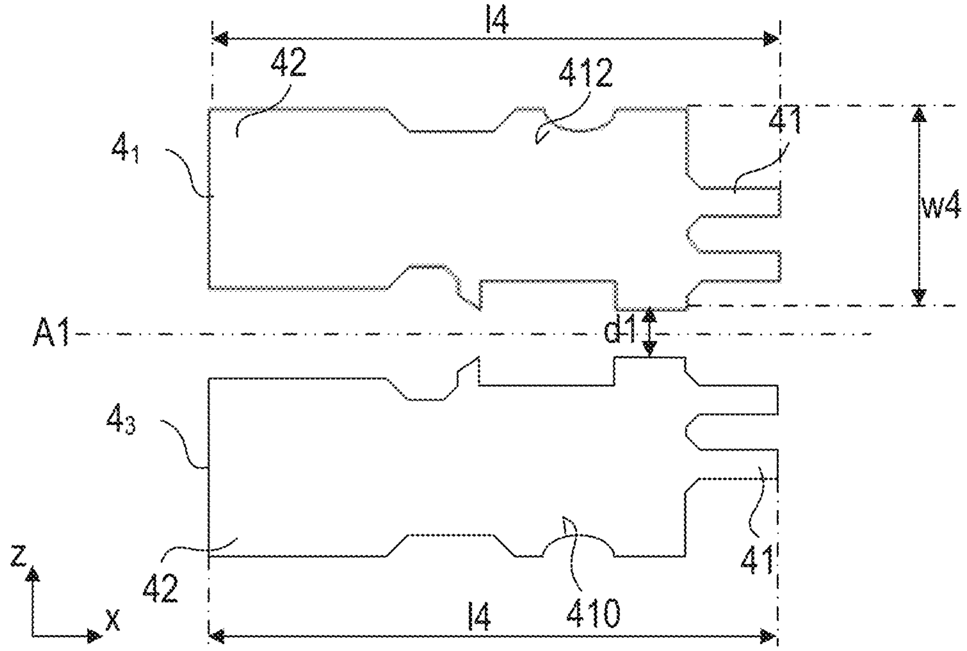

Now referring to FIG. 5B, each of the bus bars 4 may have a maximum length 14 in the first horizontal direction x between the first end 41 and the second end 42, and a maximum width w4 in the second horizontal direction z perpendicular to the first horizontal direction x. According to one example, the maximum length 14 of each of the plurality of bus bars 4 may be at least 10 times larger, at least 30 times larger, or at least 50 times larger than the thickness t4 of the respective bus bar 4, and the maximum width w4 of each of the plurality of bus bars 4 may be at least 5 times, at least 10 times, or at least 30 times larger than the thickness t4 of the respective bus bar 4, wherein the maximum length 14 of each of the plurality of bus bars 4 may be larger than the maximum width w4 of the respective bus bar 4. According to one example, the maximum length 14 is at least twice or at least three times the maximum width w4.

Figure 6:
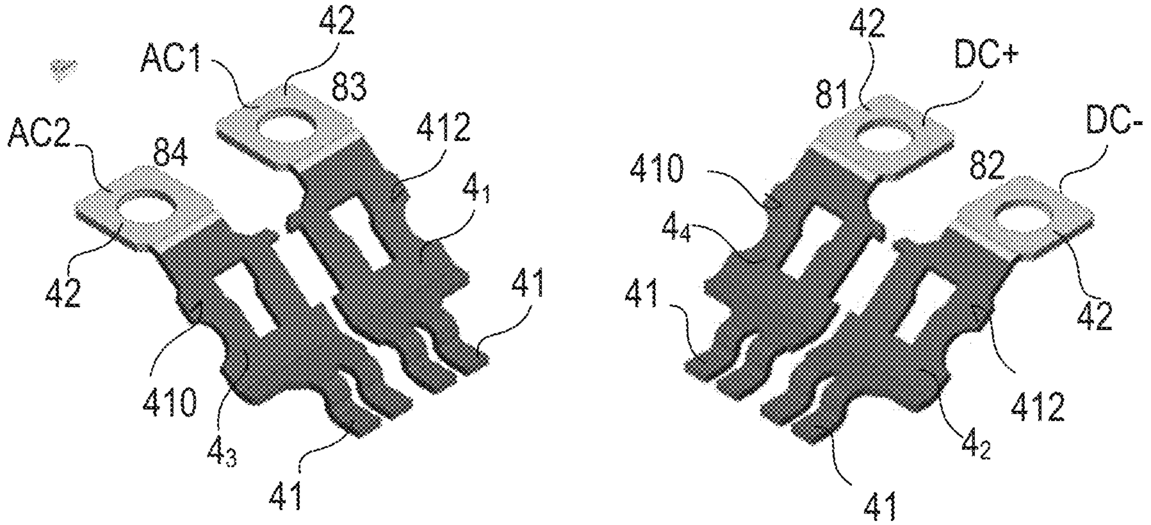
FIG. 6 schematically illustrates a three-dimensional view of a plurality of bus bars according to one example.
Figure 7:
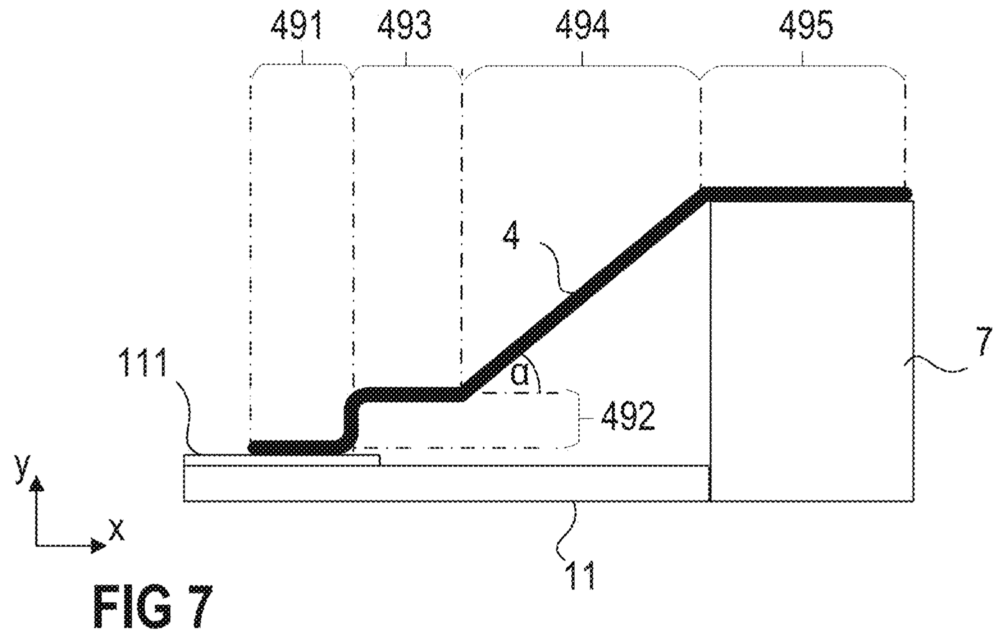
FIG. 7 schematically illustrates a side view of a bus bar arranged in a power semiconductor module arrangement according to one example.

As is schematically illustrated in FIGS. 1, 6 and 7, each of the bus bars 4 may be bent at least once along its length 14. Each of the bus bars 4 may comprise at least one horizontal section 495 extending in a horizontal plane in parallel to the substrate 10. The at least one horizontal section 495 may be arranged at or form the second end 42 of the respective bus bar 4, for example. In this way, at least for some applications, it may be easier to electrically contact the bus bars 4 at their second ends 42. Each of the bus bars 4 may further comprise one or more vertical sections 492 and/or one or more diagonal sections 494. The bus bars 4 as illustrated in FIG. 1 comprise one vertical section extending from the substrate 10 through the inside of the housing 7, and one horizontal section at the second end 42 of the bus bar 4, wherein the horizontal section is arranged outside of the housing 7.

As is schematically illustrated in FIG. 7, a second horizontal section 491 extending in a horizontal plane in parallel to the substrate 10 may be arranged at or form the first end 41 of the bus bar 4. This may allow to form a reliable and stable mechanical and electrical connection between the bus bar 4 and the respective section of the first metallization layer 111, for example. The at least one horizontal section 495 and the second horizontal section 491, however, extend in different horizontal planes. In the example illustrated in FIG. 7, the bus bar 4 further comprises a vertical section 492 adjacent to the second horizontal section 491, wherein the vertical section 492 extends in a vertical direction y perpendicular to the top surface of the substrate 10, and a third horizontal section 493 adjacent to the vertical section 492 and extending in a horizontal plane in parallel to the substrate 10. The vertical section 492 is arranged between the second horizontal section 491 and the third horizontal section 493. A diagonal section 494 is arranged and extends diagonally between the third horizontal section 493 and the first horizontal section 495. That is, an angle α formed between the diagonal section 494 and the horizontal plane is between 0° and 90°, or between 20° and 60°, for example. The bus bar 4 illustrated in FIG. 7, however, is only an example. Depending on the geometries of the substrate 10, the housing 7 and any other components of the power semiconductor module arrangement 100, the bus bar 4 may comprise any other number of horizontal, vertical and/or diagonal sections.

Figure 8:
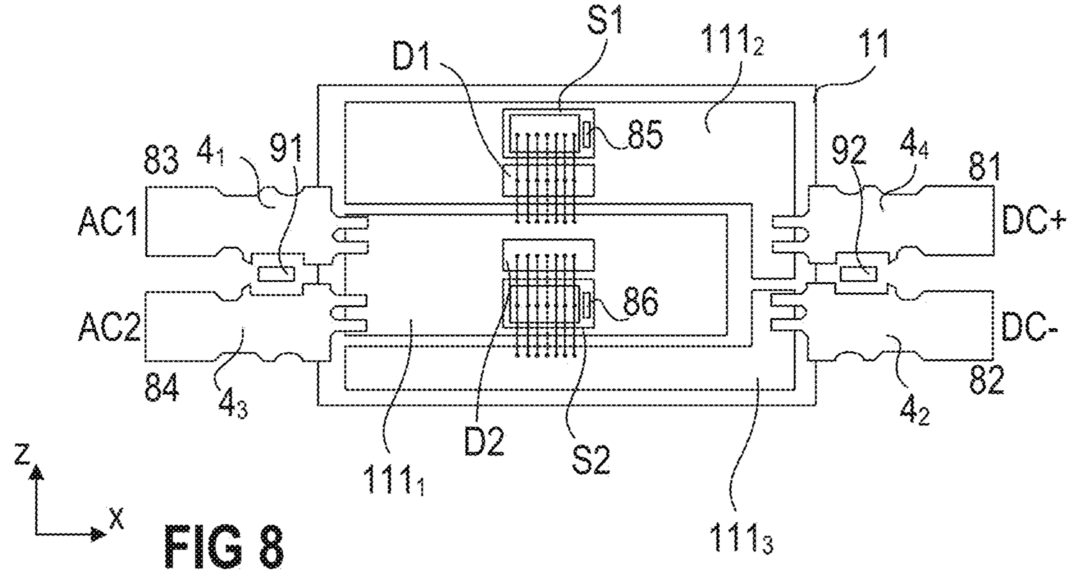
FIG. 8 schematically illustrates a top view of a power semiconductor module arrangement according to another example.

Referring to FIGS. 5B, 6 and 8, for example, the first bus bar $\mathbf{4}_1$ and the second bus bar 42 may be coupled to the substrate 10 such that their first surfaces 410 face toward the substrate 10 and their second surfaces 412 face away from the substrate 10. The third bus bar 43 and the fourth bus bar $\mathbf{4}_4$, on the other hand, may be coupled to the substrate 10 such that their second surfaces 412 face toward the substrate 10 and their first surfaces 410 face away from the substrate 10. That is, each pair of bus bars 4 may comprise one bus bar 4 with its first side 410 facing the substrate 10, and one bus bar 4 with its second side 412 facing the substrate 10. Each pair of bus bars 4, therefore, is symmetrical along an axis of symmetry A1 extending centrally between the respective bus bars 4 (see, e.g., FIG. 5B), even if the shape of each individual bus bar 4 as defined by the outline of the first surface 410 is asymmetric. The advantages of such a symmetric arrangement of the bus bars 4 of a pair of bus bars will be described further below.

For some applications it is advantageous or even necessary to determine a current through one or more of the bus bars 4. For example, it may be desirable to determine a phase current at the output node 83, 84. As the first bus bar $\mathbf{4}_1$ and the third bus bar $\mathbf{4}_3$ are connected to the same section $\mathbf{111}_1$ of the first metallization layer 111 with their first ends 41, and to the same output potential AC (the same load) at their second ends AC, the overall phase current will be divided. That is, the first bus bar $\mathbf{4}_1$ may conduct a fraction of the overall phase current, and the third bus bar $\mathbf{4}_3$ may conduct a fraction of the overall phase current. The fraction of the overall phase current conducted by each of the first bus bar $\mathbf{4}_1$ and the third bus bar $\mathbf{4}_3$, however, is not necessarily 50%. It is generally possible that one fraction is greater than the other. In some extreme cases it may even happen that one of the bus bars $\mathbf{4}_1$, $\mathbf{4}_3$ conducts the entire current (100% of the overall phase current).

It is generally possible to determine a current through each of the first bus bar $\mathbf{4}_1$ and the third bus bar $\mathbf{4}_3$ separately. This requires two separate sensor elements, each sensor element configured to determine the current in a different one of the first bus bar $\mathbf{4}_1$ and the third bus bar $\mathbf{4}_3$. Each sensor element may be or may comprise a magnetic field sensor, for example, that is configured to detect the strength of a magnetic field. A magnetic field sensor may be or may comprise a Hall sensor, for example. Such a magnetic field sensor may be arranged in close proximity to (i.e., within the range of a magnetic field caused by a current flowing through the bus bar 4) and may be electrically insulated from the respective bus bar 4. Electric insulation may be provided, for example, by means of an air gap between the sensor element and the respective bus bar 4. That is, the sensor element may be arranged at a defined distance from the bus bar 4. It is also possible that an encapsulant fills the resulting area between the sensor element and the bus bar 4, resulting in even further electric insulation. Evaluation means may be configured to determine the current flowing through the respective bus bar 4 based on the strength of the magnetic field detected by the magnetic field sensor.

As has been described above, the overall phase current is divided between the two bus bars $\mathbf{4}_1$, $\mathbf{4}_3$. At best, the current divides equally between the bus bars $\mathbf{4}_1$, $\mathbf{4}_3$ such that 50% of the overall current flows through each of the bus bars $\mathbf{4}_1$, $\mathbf{4}_3$. It is, however, also possible that the current through one of the bus bars $\mathbf{4}_1$, $\mathbf{4}_3$ is comparably low, e.g., less than 20% of the overall phase current. Such low currents may be difficult to determine. As the distribution of the currents over the two bus bars $\mathbf{4}_1$, $\mathbf{4}_3$ may vary over time, this may result in unwanted information loss and, therefore, in measuring errors. Variations of the current division factor may deteriorate the accuracy of the current measurement if only one current is measured, and under the assumption that the current division is constant (the current division factor is usually not known). The knowledge about only one of the two currents, therefore, is generally not sufficient to be able to determine the overall current, as the distribution of the currents over the two bus bars $\mathbf{4}_1$, $\mathbf{4}_3$ is not constant and may vary. Even further, measuring two currents independently may be cost-intensive and cumbersome. The signals obtained from two separate sensor elements need to be calibrated separately and subsequently be combined appropriately to determine the overall current. Therefore, according to one example and as is schematically illustrated in FIG. 8, the overall phase current may be determined by means of only one first sensor element 91 arranged between the first bus bar $\mathbf{4}_1$ and the third bus bar $\mathbf{4}_3$ and configured to detect a strength of a magnetic field caused by a first current flowing through the first bus bar $\mathbf{4}_1$ and a second current flowing through the third bus bar $\mathbf{4}_3$. That is, the first sensor element 91 is arranged in close proximity to both the first bus bar $\mathbf{4}_1$ and the third bus bar $\mathbf{4}_3$ and therefore within the range of a magnetic field caused by a first current flowing through the first bus bar $\mathbf{4}_1$ as well as in the range of a magnetic field caused by a second current flowing through the third bus bar $\mathbf{4}_3$. The detected strength of the magnetic fields therefore is indicative of a sum of the first current and the second current. The sum of the first current and the second current is always the overall phase current, irrespective of the distribution of the phase current between the bus bars $\mathbf{4}_1$, $\mathbf{4}_3$. This arrangement with only one first sensor element 91, therefore, allows to save the costs for an additional sensor element while allowing detection of the overall phase current at high accuracy.

Figure 9:
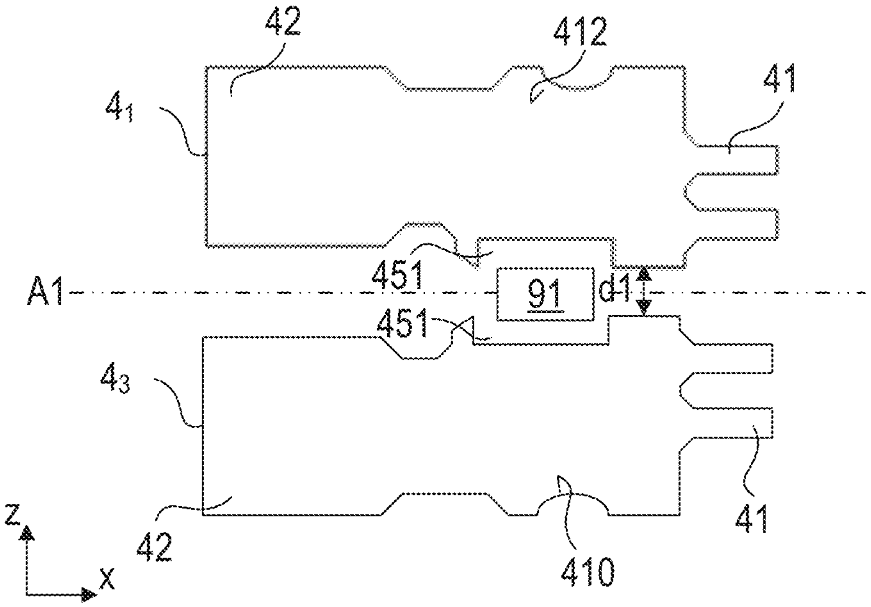
FIG. 9 schematically illustrates a top view of a bus bar arrangement of a power semiconductor module arrangement according to one example.

According to one example, and as is schematically illustrated in further detail in FIG. 9, the first bus bar $\mathbf{4}_1$ and the third bus bar $\mathbf{4}_3$ may each comprise a recess 451. When the first bus bar $\mathbf{4}_1$ and the third bus bar $\mathbf{4}_3$ are arranged adjacent to each other with the first surface 410 of the first bus bar $\mathbf{4}_1$ facing toward the substrate 10 and the second surface 412 of the third bus bar $\mathbf{4}_3$ facing toward the substrate 10, the recesses 451 may be arranged adjacent to each other to form an opening which allows to place the first sensor element 91 between the bus bars $\mathbf{4}_1$, $\mathbf{4}_3$.

Figure 10:
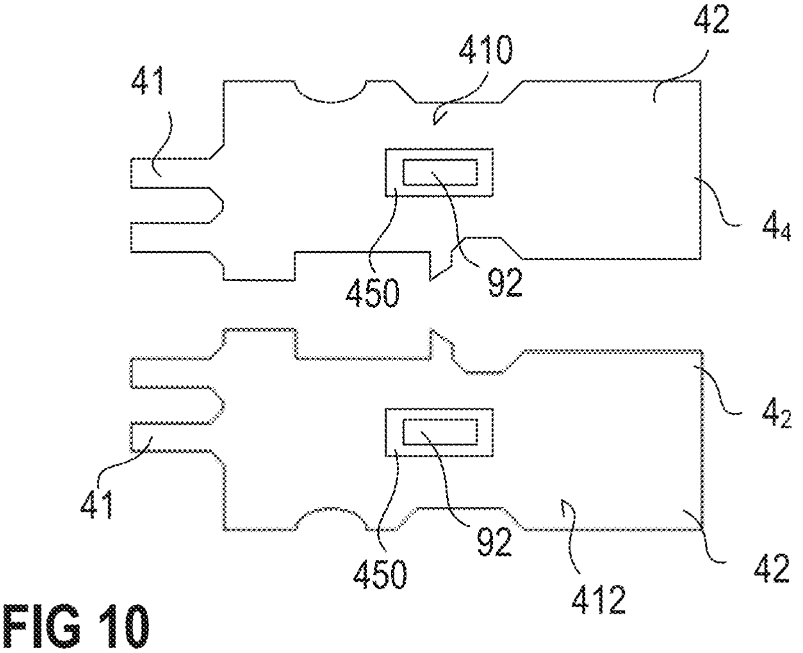
FIG. 10 schematically illustrates a top view of a bus bar arrangement of a power semiconductor module arrangement according to another example.

It may further be required to determine a current through the second bus bar $\mathbf{4}_2$ and the fourth bus bar $\mathbf{4}_4$, for example. Similar to what has been described above, two second sensor elements 92 may be used to determine the currents through the second bus bar $\mathbf{4}_2$ and the fourth bus bar $\mathbf{4}_4$ independent from each other. As is schematically illustrated in FIG. 10, each of the bus bars 4 may comprise an opening 450 formed in the metal sheet and extending from the first surface 410 to the second surface 412. Each of the second sensor elements 92 may be arranged in a different one of the openings 450. This may be implemented in a similar way with regard to the first and third bus bars $4_1$, $4_3$ if the phase current is determined by means of two separate first sensor elements 91.

Figure 12:
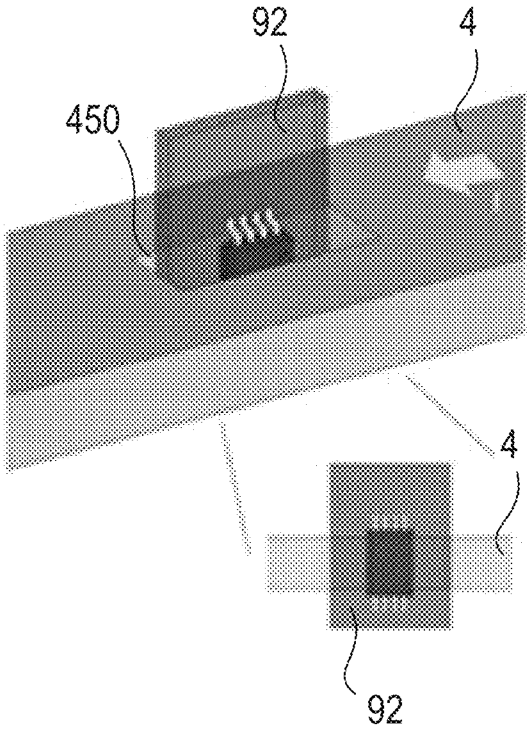
FIG. 12 schematically illustrates a three-dimensional view and a cross-sectional view of a section of a bus bar and a sensor element.

In the example of a half-bridge arrangement, there is always only a current flowing through the second bus bar $4_2$ or through the fourth bus bar $4_4$. That is, while a current flows through the second bus bar $4_2$ (e.g., second switching element S2 in a conducting state, first switching element S1 in a non-conducting state), a current through the fourth bus bar $4_4$ is zero, and vice versa. In a half-bridge arrangement, the high-side switch and the low-side switch are generally not in a conducting state at the same time. One of the switching elements is always switched from a conducting state to a non-conducting state before the other switching element is switched from a non-conducting state to a conducting state. Therefore, it is generally possible to omit one of the second sensor elements 92. If, for example, the overall current $I(4_1, 4_3)$ through the first and third bus bars $4_1$, $4_3$ and the current $I(4_4)$ through, e.g., the fourth bus bar $4_4$ are known, the current $I(4_2)$ through the second bus bar $4_2$ can be deduced as: $I(4_2)=I(4_1, 4_3)-I(4_4)$. As can be seen, additionally determining the current through the second bus bar $4_2$ would therefore not provide any additional information. According to one example, one second sensor element 92 is arranged in an opening 450 provided in the fourth bus bar $4_4$, while the opening 450 provided in the second bus bar $4_2$ remains empty (no second sensor element 92 arranged in the opening 450 provided in the second bus bar $4_2$). It is, however, also possible that one second sensor element 92 is arranged in an opening 450 provided in the second bus bar $4_2$, while the opening 450 provided in the fourth bus bar $4_4$ remains empty (no second sensor element 92 arranged in the opening 450 provided in the fourth bus bar $4_4$). According to an even further example, and as is schematically illustrated in FIG. 8, a second sensor element 92 may be arranged in the gap between the second bus bar $4_2$ and the fourth bus bar $4_4$, similar to what has been described with respect to the first sensor element 91 and the first and third bus bars $4_1$, $4_3$ above. As the current through one of the second bus bar $4_2$ and the fourth bus bar $4_4$ is always zero, the current determined by the second sensor element 92 at a certain point in time is always the current through the respective other one of the second bus bar $4_2$ and the fourth bus bar $4_4$. A second sensor element 92 arranged in an opening 450 provided in a bus bar 4 is illustrated in further detail in FIG. 12, which schematically illustrates a three-dimensional view of a section of a respective bus bar 4 and a cross-sectional view of the respective section.

Openings 450 may not only be provided in the second bus bar $4_2$ and the fourth bus bar $4_4$. As has been described above, the outline of each of the plurality of bus bars 4 may be identical to the outline of each of the other bus bars 4 of the plurality of bus bars 4. This allows to produce each of the plurality of bus bars 4 with the same stamping tool, for example. An opening 450 may be formed with the same stamping tool and during the same production step. Therefore, each of the plurality of bus bars 4 may comprise an opening 450, irrespective of whether or not a sensor element 91, 92 is arranged in the opening 450. The different bus bars 4, therefore, are easy to produce by means of the same tools. Even further, when assembling the power semiconductor module arrangement 100, there is no need to verify that a bus bar having the correct shape and dimensions is used to form the first, second, third and fourth bus bars $4_1$, $4_2$, $4_3$, $4_4$. This makes the arrangement very flexible, cost-effective and easy to produce.

Figure 11:
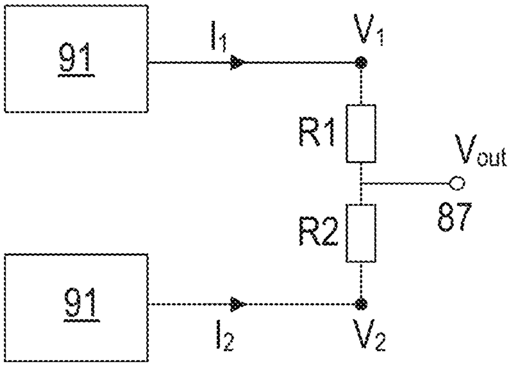
FIG. 11 schematically illustrates a sensor circuit arrangement according to one example.

If the overall phase current through the first and the third bus bar $4_1$, $4_3$ is determined by means of two separate first sensor elements 91, signal reading as well as the calibration process of the obtained signals may be simplified by a resistor arrangement, for example. This is schematically illustrated in FIG. 11. The output of magnetic field sensors is usually analog and single ended. This, however, is only an example, the output can generally also be differential. The deviation of an output voltage relative to a constant reference voltage is proportional to the measured current. Therefore, an average of the output voltages of two first sensor elements 91 representing the two terminal currents $I_1$, $I_2$ corresponds to the averaged current value, i.e. $(I_1+I_2)/2$, which is exactly half of the overall AC phase current. The described averaging can be achieved by means of two resistors R1, R2 that are nominally equal. A first resistor R1 is arranged between one of the first sensor elements 91 and a sensor output node 87, and a second resistor R2 is arranged between the other one of the first sensor elements 91 and the sensor output node 87. Doubling the averaged signal can be considered to represent the overall phase current.

As deduced from equations (1) to (8) as presented below, the variability of the current division factor d (e.g., around 0.5) can be almost completely suppressed with this resistor arrangement. The ε tolerance of the resistors R1, R2 is generally not critical. Together with the coupling factors $c_1$, $c_2$ and given sensitivity factors $S_1$, $S_2$ of the two first sensor elements 91, the ε tolerance merely has an influence on the $K_{system}$ parameter, which can be entirely calibrated out to reach a specified $S_{target}$ target sensitivity in mV/A. Therefore, their effect is cancelled out by means of the calibration at a specific point in time.

$$I_1 = I \cdot d \rightarrow B_1 = c_1 \cdot I_1 = c_1 \cdot I \cdot d \tag{1}$$

$$I_2 = I \cdot (1-d) \rightarrow B_2 = c_2 \cdot I_2 = c_2 \cdot I \cdot (1-d) \tag{2}$$

$$U_{1,2} = U_0 + S_{1,2} \cdot f(\mathrm{GAIN\_CW}) \cdot B_{1,2} \tag{3}$$

$$U_{out} = \frac{U_1 \cdot R_2 + U_2 \cdot R_1}{R_1 + R_2} \tag{4}$$

$$R_1 = R \cdot (1+\varepsilon);\ R_2 = R \cdot (1-\varepsilon) \tag{5}$$

$$U_{out} = U_0 + I \cdot f(\mathrm{GAIN\_CW}) \cdot \frac{S_1 \cdot c_1 \cdot d + S_2 \cdot c_2 \cdot (1-d) + \varepsilon \cdot [S_2 \cdot c_2 \cdot (1-d) - S_1 \cdot c_1 \cdot d]}{2} \tag{6}$$

$$U_{out} = U_0 + I \cdot f(\mathrm{GAIN\_CW}) \cdot K_{system} \tag{7}$$

$$\mathrm{GAIN}_{CW} = f^{-1}\left(\frac{S_{target}}{K_{system}}\right). \tag{8}$$

The power semiconductor module arrangement 100 has been described with respect to a half-bridge arrangement above. Generally, however, the semiconductor arrangement of a power semiconductor module arrangement 100 may be implemented in any other way instead and is not restricted to a half-bridge arrangement. Supply voltages may be provided to any other kind of semiconductor arrangement by means of identical bus bars 4, similar to what has been described above.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module arrangement, comprising:

a housing;

a substrate arranged in or forming a bottom of the housing, the substrate comprising a dielectric insulation layer and a first metallization layer attached to the dielectric insulation layer;

a semiconductor arrangement arranged on the substrate;

a plurality of bus bars electrically coupled to each other by the semiconductor arrangement and/or the first metallization layer, each of the plurality of bus bars comprising a first end, a second end opposite the first end, a first surface having a first outline, and a second surface opposite the first surface, the second surface having a second outline that is a projection of the first outline; and a sensor element arranged between two bus bars of the plurality of bus bars, wherein the sensor element is configured to detect a strength of a magnetic field caused by a first current flowing through one of the two bus bars and a second current flowing through the other one of the two bus bars, wherein the detected strength of the magnetic field is indicative of a sum of the first current and the second current, wherein the first end of each of the plurality of bus bars is electrically and mechanically coupled to the substrate, and the second end of each of the plurality of bus bars extends to the outside of the housing, wherein each of the plurality of bus bars comprises a metal sheet, wherein the outline of the first surface of a bus bar is identical to the outline of the first surface of each of the other bus bars of the plurality of bus bars.

2. The power semiconductor module arrangement of claim 1, wherein each of the plurality of bus bars is bent at least once along its length.

3. The power semiconductor module arrangement of claim 2, wherein each of the plurality of bus bars comprises at least one horizontal section and at least one of one or more vertical sections or one or more diagonal sections.

4. The power semiconductor module arrangement of claim 2, wherein the plurality of bus bars comprises at least four bus bars, wherein a first bus bar and a second bus bar of the at least four bus bars are coupled to the substrate such that the first surface of both the first bus bar and the second bus bar faces toward the substrate and the second surface of both the first bus bar and the second bus bar faces away from the substrate, and wherein a third bus bar and a fourth bus bar of the at least four bus bars are coupled to the substrate such that the second surface of both the third bus bar and the fourth bus bar face toward the substrate and the first surface of both the third bus bar and the fourth bus bar face away from the substrate.

5. The power semiconductor module arrangement of claim 4, wherein the first metallization layer comprises at least three separate sections, wherein the first bus bar and the third bus bar are coupled to a first section of the first metallization layer, wherein the second bus bar is coupled to a third section of the first metallization layer, and wherein the fourth bus bar is coupled to a second section of the first metallization layer.

6. The power semiconductor module arrangement of claim 5, further comprising:

a first switching element arranged on the second section of the first metallization layer; and a second switching element arranged on the first section of the first metallization layer, wherein the fourth bus bar is configured to be operatively coupled to a first electrical potential and the second bus bar is configured to be operatively coupled to a second electrical potential, wherein the first bus bar and the third bus bar are configured to be coupled to an output potential, wherein each of the first switching element and the second switching element comprises a control terminal and a controllable load path between two load terminals, the load paths of the first switching element and the second switching element being operatively coupled in series and between the first electrical potential and the second electrical potential, wherein the first switching element and the second switching element are operatively coupled with each other and with the output potential via a first common node.

7. The power semiconductor module arrangement of claim 6, wherein the first switching element comprises at least one IGBT, at least one MOSFET, at least one JFET, or at least one HEMT, and/or wherein the second switching element comprises at least one IGBT, at least one MOSFET, at least one JFET, or at least one HEMT.

8. The power semiconductor module arrangement of claim 4, wherein the first bus bar and the third bus bar are arranged adjacent to each other, wherein a shortest distance between the first bus bar and the third bus bar in a horizontal direction is between 1 and 60 mm, between 1 and 10 mm, or between 3 and 7 mm, wherein the second bus bar and the fourth bus bar are arranged adjacent to each other, wherein a shortest distance between the second bus bar and the fourth bus bar in a horizontal direction is between 1 and 60 mm, between 1 and 10 mm, or between 3 and 7 mm.

9. The power semiconductor module arrangement of claim 1, wherein a shape of a bus bar of the plurality of bus bars defined by the outline of the first surface is asymmetric.

10. The power semiconductor module arrangement of claim 1, wherein each of the plurality of bus bars has a same thickness, and wherein the thickness corresponds to a distance between the first surface and the second surface.

11. The power semiconductor module arrangement of claim 1, wherein a maximum length of each of the plurality of bus bars is at least 10 times larger, at least 30 times larger, or at least 50 times larger than a thickness of the respective bus bar, wherein a maximum width of each of the plurality of bus bars is at least 5 times, at least 10 times, or at least 30 times larger than the thickness of the respective bus bar, and wherein the maximum length of each of the plurality of bus bars is larger than the maximum width of the respective bus bar.

12. The power semiconductor module arrangement of claim 1, wherein each of the plurality of bus bars further comprises legs extending from the metal sheet, and wherein the legs are arranged at or form the first end of the bus bar and are electrically and mechanically connected to the substrate.

13. A power semiconductor module arrangement, comprising:

a housing;

a substrate arranged in or forming a bottom of the housing, the substrate comprising a dielectric insulation layer and a first metallization layer attached to the dielectric insulation layer;

a semiconductor arrangement arranged on the substrate;

a plurality of bus bars electrically coupled to each other by the semiconductor arrangement and/or the first metallization layer, each of the plurality of bus bars comprising a first end, a second end opposite the first end, a first surface having a first outline, and a second surface opposite the first surface, the second surface having a second outline that is a projection of the first outline; and a sensor element, wherein the first end of each of the plurality of bus bars is electrically and mechanically coupled to the substrate, and the second end of each of the plurality of bus bars extends to the outside of the housing, wherein the outline of the first surface of a bus bar is identical to the outline of the first surface of each of the other bus bars of the plurality of bus bars, wherein each of the plurality of bus bars comprises a metal sheet having an opening that extends from the first surface to the second surface, and wherein the sensor element is arranged in the opening of one of the bus bars.

14. A power semiconductor module arrangement, comprising:

a housing;

a substrate arranged in or forming a bottom of the housing, the substrate comprising a dielectric insulation layer and a first metallization layer attached to the dielectric insulation layer;

a semiconductor arrangement arranged on the substrate; and a plurality of bus bars electrically coupled to each other by the semiconductor arrangement and/or the first metallization layer, each of the plurality of bus bars comprising a first end, a second end opposite the first end, a first surface having a first outline, and a second surface opposite the first surface, the second surface having a second outline that is a projection of the first outline, wherein the first end of each of the plurality of bus bars is electrically and mechanically coupled to the substrate, and the second end of each of the plurality of bus bars extends to the outside of the housing, wherein each of the plurality of bus bars comprises a metal sheet, wherein the outline of the first surface of a bus bar is identical to the outline of the first surface of each of the other bus bars of the plurality of bus bars, wherein a maximum length of each of the plurality of bus bars is at least 10 times larger, at least 30 times larger, or at least 50 times larger than a thickness of the respective bus bar, wherein a maximum width of each of the plurality of bus bars is at least 5 times, at least 10 times, or at least 30 times larger than the thickness of the respective bus bar, and wherein the maximum length of each of the plurality of bus bars is larger than the maximum width of the respective bus bar.

* * * * *